United States Patent
Homma et al.

(10) Patent No.: US 11,811,028 B2
(45) Date of Patent: Nov. 7, 2023

(54) ON-VEHICLE SYSTEM, SECONDARY BATTERY MANAGEMENT SYSTEM, CHARGE RATE OUTPUT METHOD, AND PROGRAM

(71) Applicant: HONDA MOTOR CO., LTD., Tokyo (JP)

(72) Inventors: Keiichiro Homma, Wako (JP); Shinichi Yokoyama, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 309 days.

(21) Appl. No.: 17/213,264

(22) Filed: Mar. 26, 2021

(65) Prior Publication Data
US 2021/0305635 A1    Sep. 30, 2021

(30) Foreign Application Priority Data
Mar. 31, 2020    (JP) .................. 2020-064349

(51) Int. Cl.
*H01M 10/44* (2006.01)
*B60L 53/30* (2019.01)
(Continued)

(52) U.S. Cl.
CPC ......... *H01M 10/448* (2013.01); *B60L 53/305* (2019.02); *B60L 53/62* (2019.02);
(Continued)

(58) Field of Classification Search
CPC .... H01M 10/448; B60L 53/305; B60L 53/62; B60L 55/00; H02J 7/007
(Continued)

(56) References Cited

U.S. PATENT DOCUMENTS

| | | | | |
|---|---|---|---|---|
| 9,969,294 | B2 * | 5/2018 | Miyashita | ............... B60R 16/03 |
| 2018/0262019 | A1 * | 9/2018 | Homma | ................. B60L 53/67 |

(Continued)

FOREIGN PATENT DOCUMENTS

| | | |
|---|---|---|
| JP | 2011-193701 | 9/2011 |
| JP | 2015-014487 | 1/2015 |
| JP | 2015-202010 | 11/2015 |
| JP | 2016-075572 | 5/2016 |
| JP | 2019-149921 | 9/2019 |

OTHER PUBLICATIONS

Japanese Notice of Allowance for Japanese Patent Application No. 2020-064349 dated Apr. 26, 2022.
(Continued)

*Primary Examiner* — Richard V Muralidar
(74) *Attorney, Agent, or Firm* — AMIN, TUROCY & WATSON, LLP

(57) ABSTRACT

An on-vehicle system according to an aspect of the present invention includes: an acquisition part that acquires a signal indicating a voltage of a secondary battery which is mounted on a vehicle; an electric power supply part that uses electric power which is supplied from an external electric power supply device and that supplies the electric power to the secondary battery or an auxiliary machine mounted on the vehicle; and an output part that outputs a charge rate of the secondary battery based on the signal indicating the voltage of the secondary battery which is acquired by the acquisition part, wherein the electric power supply part controls output electric power such that stored electric power of the secondary battery is constant in a case where the vehicle stops and the charge rate of the secondary battery is output.

5 Claims, 5 Drawing Sheets

(51) Int. Cl.
*H02J 7/00* (2006.01)
*B60L 55/00* (2019.01)
*B60L 53/62* (2019.01)
*B60L 58/16* (2019.01)
*H02J 3/32* (2006.01)
*G01R 31/382* (2019.01)

(52) U.S. Cl.
CPC ............... *B60L 55/00* (2019.02); *B60L 58/16* (2019.02); *G01R 31/382* (2019.01); *H02J 3/322* (2020.01); *H02J 7/007* (2013.01); *H01M 2220/20* (2013.01); *H02J 2310/48* (2020.01)

(58) Field of Classification Search
USPC .................................................. 320/134–136
See application file for complete search history.

(56) References Cited

U.S. PATENT DOCUMENTS

| | | | | |
|---|---|---|---|---|
| 2019/0302192 A1* | 10/2019 | Gokyu | ............... | G01R 31/3842 |
| 2020/0072911 A1* | 3/2020 | Koga | ................... | G01R 31/388 |
| 2020/0290473 A1* | 9/2020 | Ogawa | .................... | B60L 55/00 |
| 2020/0384887 A1* | 12/2020 | Yokoyama | .............. | B60L 58/24 |

OTHER PUBLICATIONS

Japanese Office Action for Japanese Patent Application No. 2020-064349 dated Jan. 25, 2022.

* cited by examiner

ON-VEHICLE SYSTEM, SECONDARY BATTERY MANAGEMENT SYSTEM, CHARGE RATE OUTPUT METHOD, AND PROGRAM

CROSS-REFERENCE TO RELATED APPLICATION

Priority is claimed on Japanese Patent Application No. 2020-064349, filed on Mar. 31, 2020, the contents of which are incorporated herein by reference.

BACKGROUND

Field of the Invention

The present invention relates to an on-vehicle system, a secondary battery management system, a charge rate output method, and a program.

Background

In the related art, a technique described in Japanese Unexamined Patent Application, First Publication No. 2015-14487 is known as a technique that estimates a capacity of a secondary battery mounted on a vehicle. A vehicle battery management device described in Japanese Unexamined Patent Application, First Publication No. 2015-14487 determines a degree of degradation of the secondary battery on the basis of a vehicle travel distance and a change in a charge level based on a charge amount and a discharge amount of the secondary battery.

SUMMARY

However, when the charge level is measured, there is a possibility that it is impossible to acquire the charge level with high accuracy in a case where the vehicle is traveling or in a case where an auxiliary machine mounted on the vehicle is consuming electric power.

An object of an aspect of the present invention is to acquire a capacity of a secondary battery with high accuracy.

An on-vehicle system according to a first aspect of the present invention includes: an acquisition part that acquires a signal indicating a voltage of a secondary battery which is mounted on a vehicle; an electric power supply part that uses electric power which is supplied from an external electric power supply device and that supplies the electric power to the secondary battery or an auxiliary machine mounted on the vehicle; and an output part that outputs a charge rate of the secondary battery based on the signal indicating the voltage of the secondary battery which is acquired by the acquisition part, wherein the electric power supply part controls output electric power such that stored electric power of the secondary battery is constant in a case where the vehicle stops and the charge rate of the secondary battery is output.

A second aspect of the present invention is the on-vehicle system according to the first aspect described above, wherein the electric power supply part may use the electric power which is supplied from the external electric power supply device and output electric power that corresponds to a consumed electric power of the auxiliary machine in a case where the vehicle stops and the charge rate of the secondary battery is output.

A third aspect of the present invention is the on-vehicle system according to the first or second aspect described above, wherein the signal indicating the voltage of the secondary battery may be a signal indicating a voltage that corresponds to an open circuit voltage of the secondary battery.

A fourth aspect of the present invention is a secondary battery management system, including: the on-vehicle system according to any one of the first to third aspects described above; and a degradation output part that outputs a degradation of the secondary battery based on a change between a first charge rate which is output based on information indicating the voltage of the secondary battery acquired by the acquisition part at a first timing at which the vehicle stops and the electric power supply part is controlled such that the stored electric power of the secondary battery is constant, and a second charge rate which is output based on information indicating the voltage of the secondary battery acquired by the acquisition part at a second timing at which the vehicle stops and the electric power supply part is controlled such that the stored electric power of the secondary battery is constant.

A charge rate output method according to a fifth aspect of the present invention includes: acquiring a signal indicating a voltage of a secondary battery which is mounted on a vehicle; using electric power which is supplied from an external electric power supply device and supplying the electric power to the secondary battery or an auxiliary machine mounted on the vehicle; and outputting a charge rate of the secondary battery based on the signal indicating the voltage of the secondary battery, wherein output electric power is controlled such that stored electric power of the secondary battery is constant in a case where the vehicle stops and the charge rate of the secondary battery is output.

A sixth aspect of the present invention is a computer-readable non-transitory recording medium that includes a program causing a computer of an on-vehicle system to execute: acquiring a signal indicating a voltage of a secondary battery which is mounted on a vehicle; using electric power which is supplied from an external electric power supply device and supplying the electric power to the secondary battery or an auxiliary machine mounted on the vehicle; and outputting a charge rate of the secondary battery based on the signal indicating the voltage of the secondary battery and to control output electric power such that stored electric power of the secondary battery is constant in a case where the vehicle stops and the charge rate of the secondary battery is output.

According to the first, third, fifth, and sixth aspects described above, by controlling the output electric power of the electric power supply part such that the stored electric power of the secondary battery is constant in a case where the vehicle stops and the charge rate of the secondary battery is output, it is possible to acquire the capacity of the secondary battery with high accuracy.

According to the fourth aspect described above, since the degradation of the secondary battery is output based on the first charge rate and the second charge rate which are output based on the information indicating the voltage of the secondary battery acquired by the acquisition part at the first timing and the second timing, it is possible to enhance an output accuracy of the degradation of the secondary battery.

DESCRIPTION OF EMBODIMENTS

Hereinafter, an embodiment of an on-vehicle system, a secondary battery management system, a charge rate output method, and a program of the present invention will be described with reference to the drawings. In the following description, it is assumed that a vehicle is an electric automobile on which a secondary battery is mounted. However, it is only necessary for the vehicle to be a vehicle which is capable of storing electric power from the outside and on which a secondary battery that supplies electric power for traveling is mounted. The vehicle may be a hybrid vehicle or a fuel-cell vehicle.

[Overview of V2G (Vehicle to Grid) System]

Figure 1:
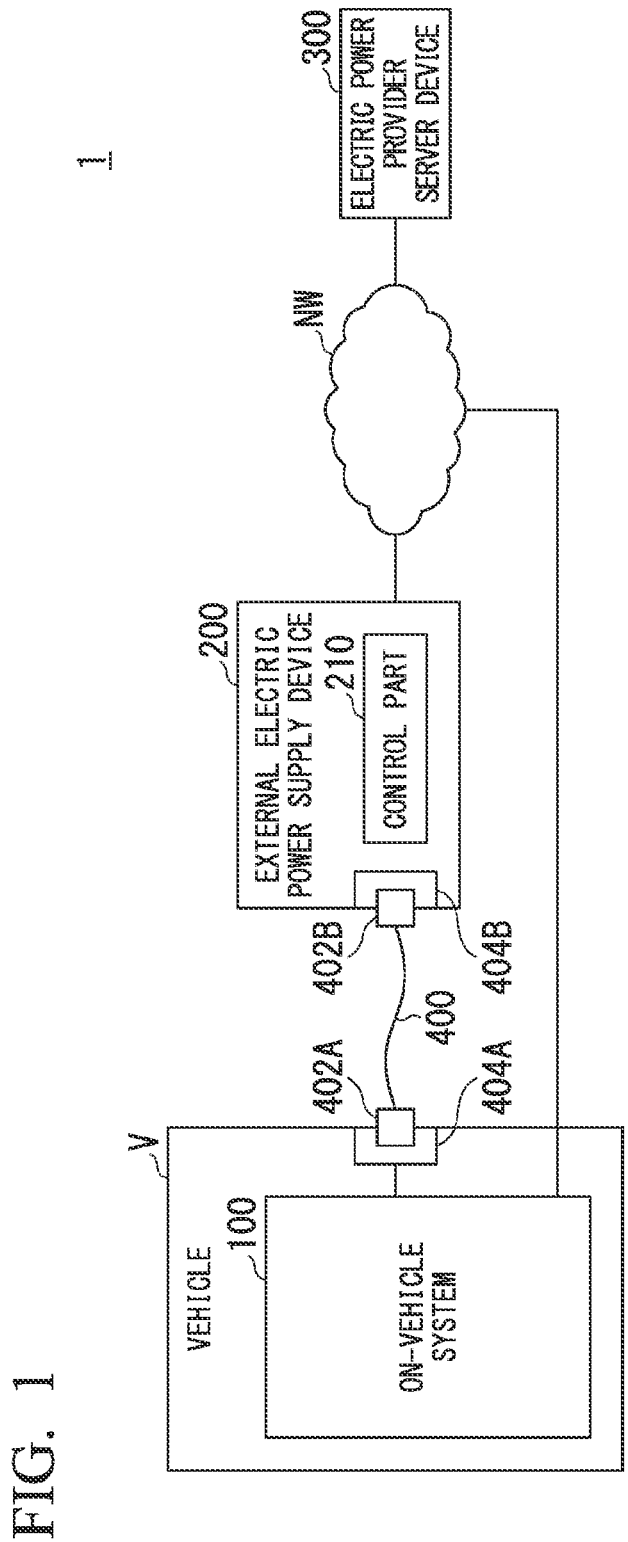
FIG. 1 is a block diagram showing an example of a V2G system according to an embodiment.

FIG. 1 is a block diagram showing an example of a V2G system 1 according to an embodiment. The V2G system 1 is a system in which electric power is exchanged between a vehicle V and an electric power system (not shown) including a commercial utility grid. The V2G system 1 includes, for example, an on-vehicle system 100, an external electric power supply device 200, and an electric power provider server device 300. The V2G system 1 of the embodiment includes one vehicle V and one external electric power supply device 200 but may include a plurality of vehicles V and a plurality of external electric power supply devices 200.

The vehicle V includes, for example, the on-vehicle system 100, a connection port 404A, and a motor for traveling (not shown). A plug 402A of a cable 400 is connected to the connection port 404A.

The vehicle V exchanges electric power with the external electric power supply device 200 via the cable 400. The cable 400 is an electric power supply cable and may include a signal line. Alternatively, in the cable 400, a signal may be superposed on the electric power supply cable.

The external electric power supply device 200 is installed, for example, in the home of the user of the vehicle V or the like. The external electric power supply device 200 includes, for example, a connection port 404B and a control part 210. A plug 402B of the cable 400 is connected to the connection port 404B. The external electric power supply device 200 exchanges electric power with the vehicle V via the cable 400. The control part 210 transmits and receives information with the on-vehicle system 100. The external electric power supply device 200 is connected to the electric power provider server device 300 via a communication network NW. The external electric power supply device 200 is connected to the electric power system including the commercial utility grid. The network NW includes, for example, the Internet, a WAN (Wide Area Network), a LAN (Local Area Network), a provider device, a wireless base station, and the like.

The electric power provider server device 300 is a server device used by an electric power provider. The electric power provider server device 300 is connected to the external electric power supply device 200 via the communication network NW.

The electric power provider server device 300 performs control such that electric power is supplied from the external electric power supply device 200 to the vehicle V and performs control such that electric power is exchanged between the vehicle V and the electric power system including the commercial utility grid.

Figure 2:
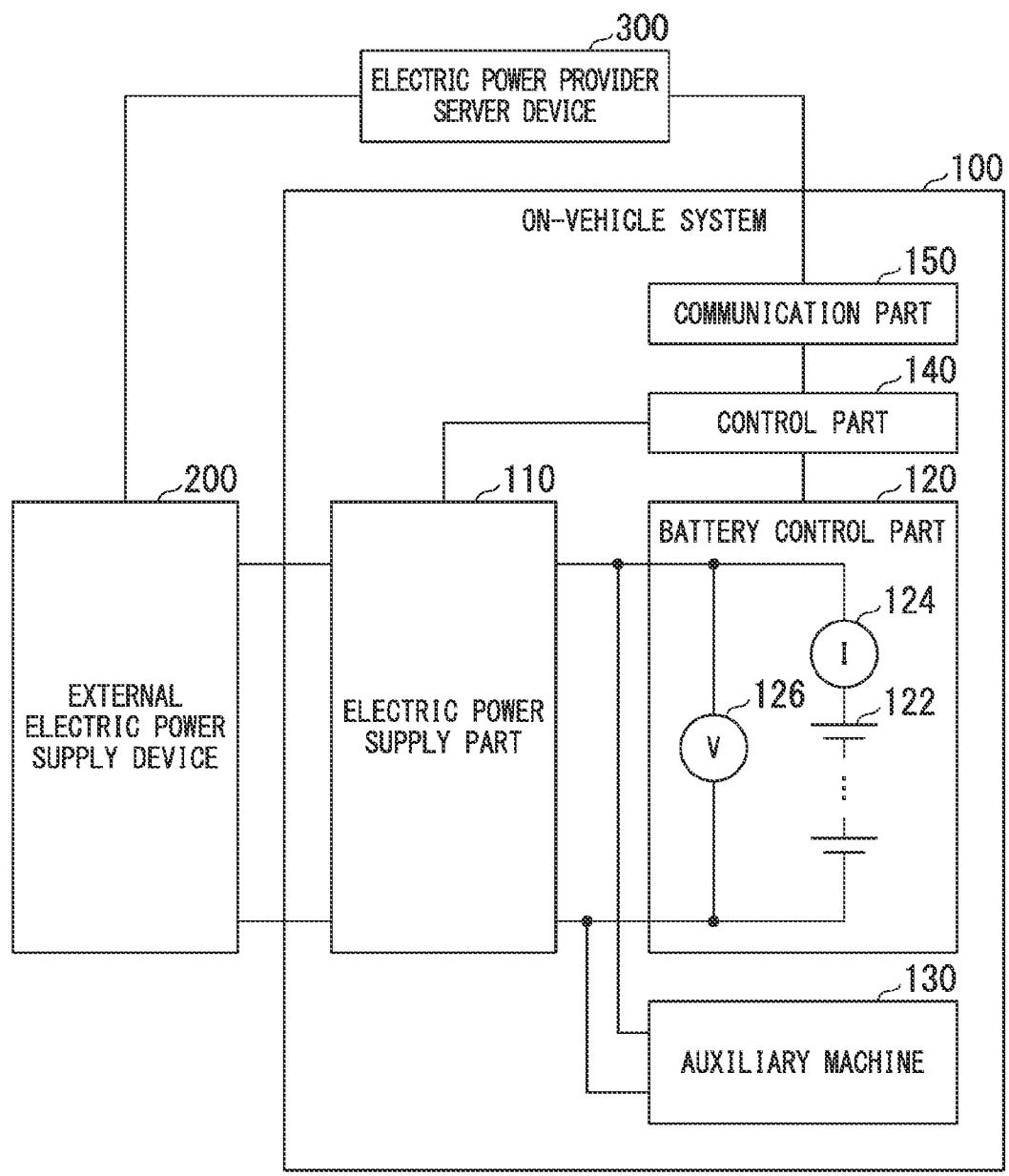
FIG. 2 is a block diagram showing an example of an on-vehicle system according to the embodiment.

FIG. 2 is a block diagram showing an example of the on-vehicle system according to the embodiment. The on-vehicle system 100 includes, for example, an electric power supply part 110, a battery control part 120, an auxiliary machine 130, a control part 140, and a communication part 150.

The electric power supply part 110 is, for example, an on-board charger (OBC) that includes a DC-DC converter, a relay, or the like. The electric power supply part 110 supplies electric power that is supplied from the external electric power supply device 200 to the battery control part 120 and the auxiliary machine 130. The electric power supply part 110 supplies electric power that is discharged from a secondary battery 122 to the auxiliary machine 130.

The battery control part 120 is, for example, an IPU (Intelligent Power Unit). The battery control part 120 includes, for example, the secondary battery 122, a current sensor 124, and a voltage sensor 126. The battery control part 120 may include a DC-DC converter, a temperature sensor, or the like (not shown). The secondary battery 122 is, for example, a lithium-ion battery. The secondary battery 122 is charged by the electric power supplied from the electric power supply part 110 and discharges the charged electric power. The current sensor 124 detects a current at the time of charging or discharging in the secondary battery 122. The voltage sensor 126 detects a voltage of both ends in the secondary battery 122.

The auxiliary machine 130 is, for example, an air conditioner or the like of the vehicle V. The auxiliary machine 130 operates by consuming electric power that is supplied from the electric power supply part 110 or electric power that is supplied from the battery control part 120.

The control part 140 is, for example, an ECU (Electronic Control Unit). The control part 140 may be implemented by a hardware processor such as a CPU (Central Processing Unit) executing a program (software). Some or all of the control part 140 may be implemented by hardware (a circuit part including circuitry) such as an LSI (Large-Scale Integration), an ASIC (Application-Specific Integrated Circuit), a FPGA (Field-Programmable Gate Array), or a GPU (Graphics-Processing Unit) or may be implemented by software and hardware in cooperation. The program may be stored in advance in a storage device (a storage device including a non-transitory storage medium) such as a HDD (Hard Disk Drive) or a flash memory. The program may be stored in a removable storage medium (a non-transitory storage medium) such as a DVD or a CD-ROM and installed by the storage medium being mounted in a drive device. The control part 140 controls the electric power supply part 110 and the battery control part 120. Further, the control part 140 functions as an output part that outputs an SOC (State of Charge; charge rate) of the secondary battery 122. Further, the control part 140 functions as a degradation output part that outputs degradation of the secondary battery 122 on the basis of a difference between SOCs at first and second timings that are earlier and later in terms of time. The SOC of the secondary battery 122 is a ratio of a remaining capacity, which is a storage capacity, to a full charge capacity.

The communication part 150 is, for example, a TCU (Telematics Control Unit). The communication part 150 transmits and receives information with the electric power provider server device 300.

Figure 3:
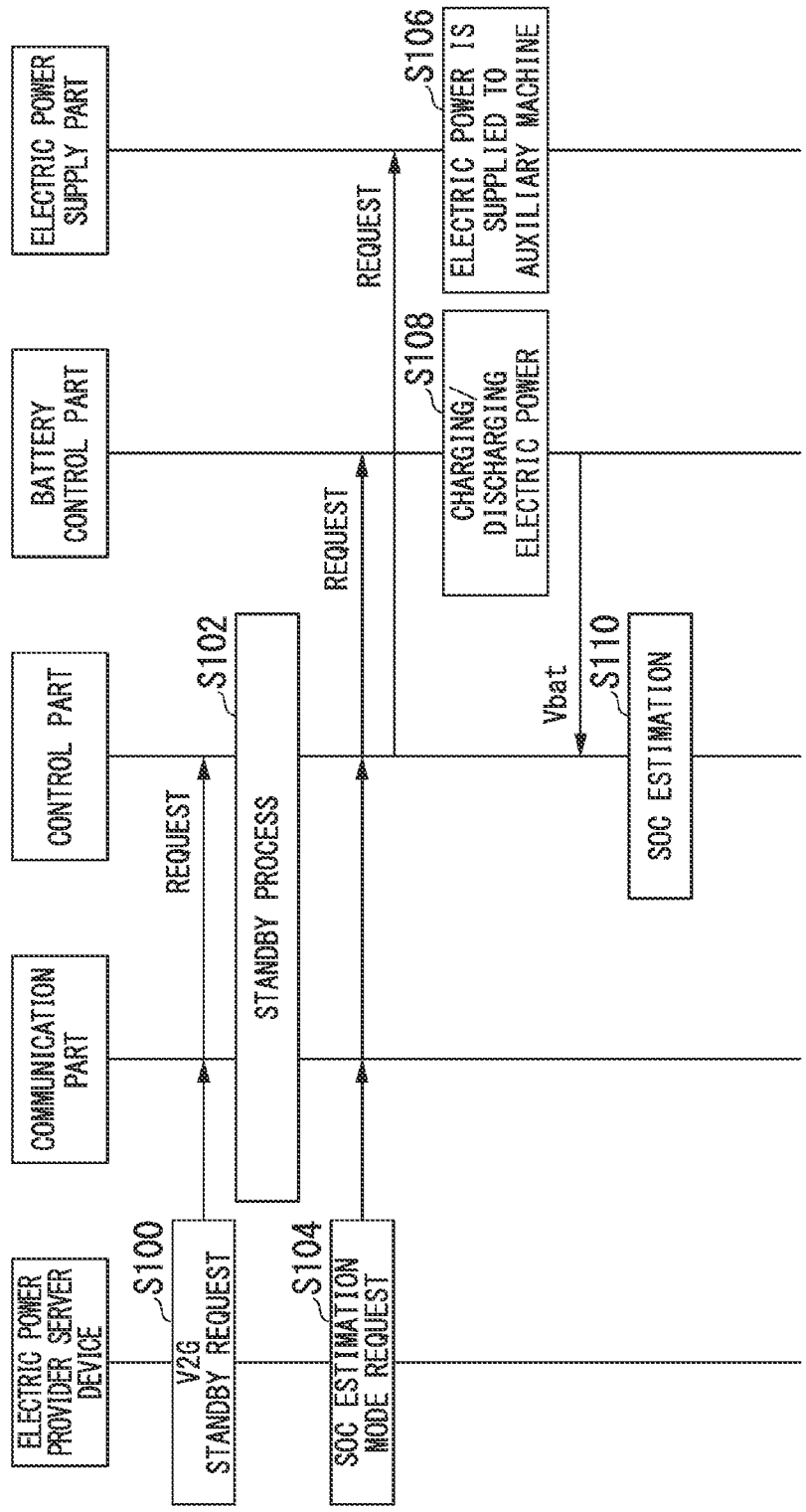
FIG. 3 is a sequence diagram showing an example of an estimation process of a SOC in the V2G system according to the embodiment.

FIG. 3 is a sequence diagram showing an example of an estimation process of a SOC in the V2G system according to the embodiment. Although a process of estimating a SOC is described in the embodiment, the estimation of the SOC is an example of an output of the SOC, and the output of the SOC is not limited to estimating the SOC.

First, the electric power provider server device 300 transmits a standby request to the on-vehicle system 100 (Step S100). The standby request is a request of moving to a mode in which a request from the electric power provider server device 300 is waited. The communication part 150 receives the standby request and supplies the standby request to the control part 140. The communication part 150 and the control part 140 perform a predetermined standby process (Step S102). The communication part 150 is caused by the standby request to be in a standby state in which a request from the electric power provider server device 300 is received, and the control part 140 is caused to be in a standby state of a process in response to a request from the electric power provider server device 300.

Next, the electric power provider server device 300 transmits a SOC estimation mode request to the communication part 150 (Step S104). The SOC estimation mode request is information requesting transition to an operation mode in which the SOC of the secondary battery 122 is estimated. The SOC estimation mode request is supplied to the control part 140 via the communication part 150. The control part 140 outputs a request of controlling the battery control part 120 and the electric power supply part 110 such that an operation in the SOC estimation mode is performed.

The electric power provider server device 300 transmits the standby request and the SOC estimation mode request to the on-vehicle system 100, for example, in a case where the vehicle V stops, the vehicle V is connected to the cable 400, and electric power is capable of being supplied to the auxiliary machine 130 of the vehicle V from the external electric power supply device 200.

The electric power supply part 110 controls output electric power such that the electric power that is supplied from the external electric power supply device 200 is supplied to the auxiliary machine 130 (Step S106). The electric power supply part 110, for example, requests electric power required for the auxiliary machine 130 to operate to the external electric power supply device 200, and the external electric power supply device 200 requests the electric power required for the auxiliary machine 130 to operate that is requested from the electric power supply part 110 to the electric power provider server device 300. Thereby, the external electric power supply device 200 receives the electric power required for the auxiliary machine 130 to operate from an electric power provider and supplies the electric power to the electric power supply part 110, and the electric power supply part 110 supplies the electric power required for the auxiliary machine 130 to operate to the auxiliary machine 130 (Steps S106 and S108). As a result, the control part 140 controls output electric power such that stored electric power of the secondary battery 122 is constant in a case where the vehicle V stops and the SOC of the secondary battery 122 is estimated. The battery control part 120 may perform control such that charging electric power and discharging electric power of the secondary battery 122 are zero (Step S108). The battery control part 120 blocks an electrical connection between the secondary battery 122, and the electric power supply part 110 and the auxiliary machine 130, for example, by controlling the DC-DC converter, the relay, or the like.

Next, the battery control part 120 (acquisition part) outputs a signal indicating a voltage Vbat of the secondary battery 122 that is detected by the voltage sensor 126 to the control part 140, and the control part 140 acquires the signal indicating the voltage Vbat. The signal indicating the voltage of the secondary battery 122 is a signal indicating a voltage that corresponds to an open circuit voltage of the secondary battery 122. The control part 140 estimates the SOC of the secondary battery 122 on the basis of the acquired signal indicating the voltage Vbat (Step S110). The control part 140 may estimate the SOC, for example, on the basis of table data indicating a correspondence relationship between the signal indicating the voltage Vbat and the SOC of the secondary battery 122. The control part 140 may estimate the SOC on the basis of a calculation expression that calculates the SOC using the signal indicating the voltage Vbat.

Figure 4:
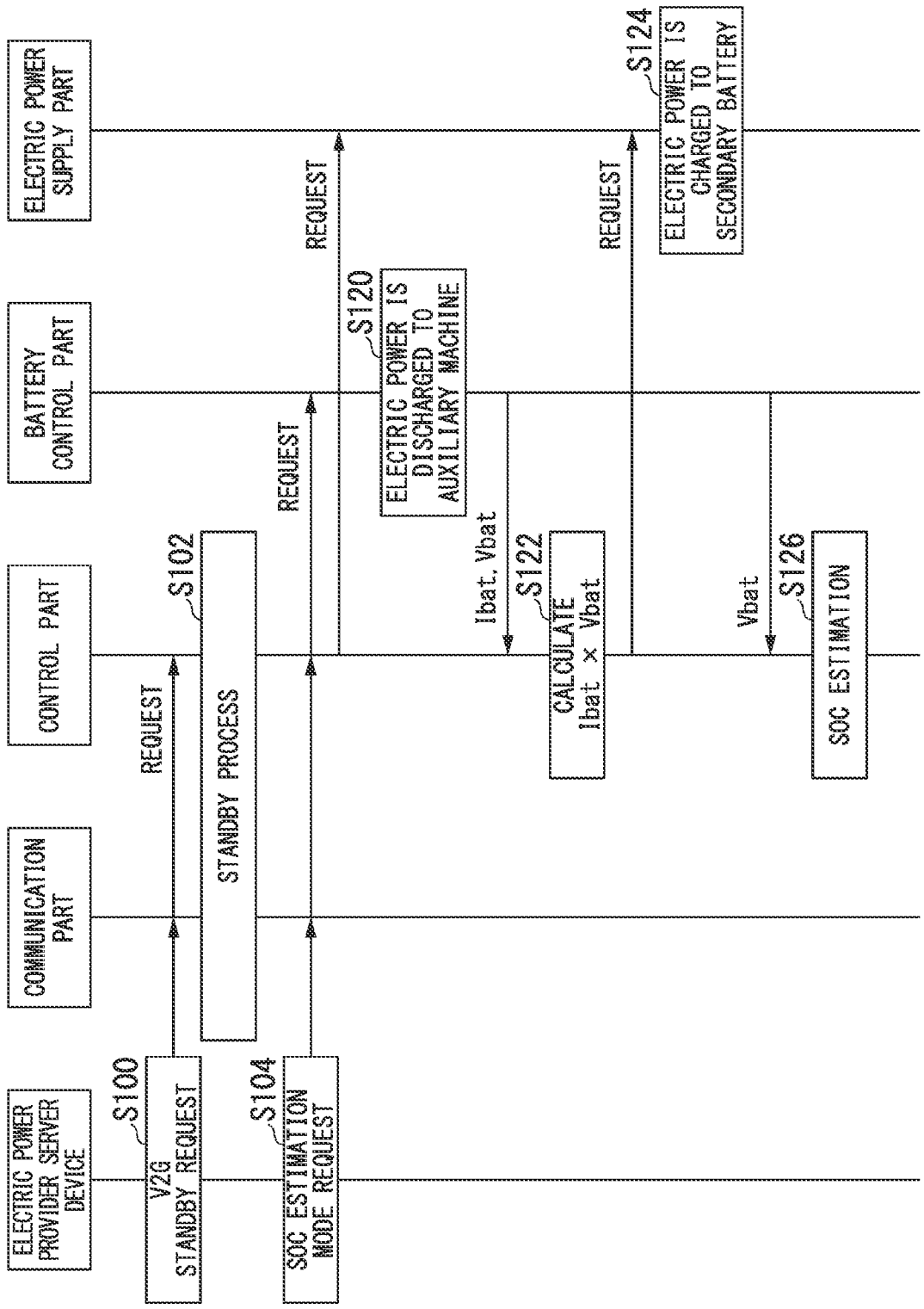
FIG. 4 is a sequence diagram showing another example of an estimation process of a SOC in the V2G system according to the embodiment.

FIG. 4 is a sequence diagram showing another example of an estimation process of a SOC in the V2G system according to the embodiment. First, the electric power provider server device 300 transmits a standby request to the on-vehicle system 100 (Step S100). The communication part 150 receives the standby request and supplies the standby request to the control part 140. The communication part 150 and the control part 140 perform a predetermined standby process (Step S102). Next, the electric power provider server device 300 transmits a SOC estimation mode request to the communication part 150 (Step S104). The SOC estimation mode request is supplied to the control part 140 via the communication part 150. The control part 140 outputs a request of controlling the battery control part 120 and the electric power supply part 110 such that an operation in the SOC estimation mode is performed. The electric power provider server device 300 transmits the standby request and the SOC estimation mode request to the on-vehicle system 100, for example, in a case where the vehicle V stops, the vehicle V is connected to the cable 400, and electric power is capable of being supplied to the auxiliary machine 130 of the vehicle V from the external electric power supply device 200.

The battery control part 120 causes the secondary battery 122 to discharge electric power required for the operation of the auxiliary machine 130 (Step S120). Next, the battery control part 120 outputs a signal indicating a current Ibat of the secondary battery 122 that is detected by the current sensor 124 to the control part 140, outputs a signal indicating a voltage Vbat of the secondary battery 122 that is detected by the voltage sensor 126 to the control part 140, and the control part 140 acquires the signal indicating the current That and the signal indicating the voltage Vbat.

The control part 140 calculates electric power obtained by multiplying the current Ibat by the voltage Vbat (Step S122). The control part 140 requests the electric power supply part 110 such that the calculated electric power is charged from the electric power supply part 110 to the secondary battery 122.

The electric power supply part 110 receives the electric power calculated by the control part 140 from the external electric power supply device 200 and charges the received electric power to the secondary battery 122 in response to a request from the control part 140 (Step S124). Thereby, the control part 140 performs control such that stored electric power of the secondary battery 122 is constant in a case where the vehicle V stops and the SOC of the secondary battery 122 is estimated. Next, the battery control part 120 outputs the signal indicating the voltage Vbat of the secondary battery 122 that is detected by the voltage sensor 126 to the control part 140, and the control part 140 acquires the signal indicating the voltage Vbat. The signal indicating the voltage of the secondary battery 122 is a signal indicating a voltage that corresponds to an open circuit voltage of the secondary battery 122. The control part 140 estimates the SOC of the secondary battery 122 on the basis of the acquired signal indicating the voltage Vbat (Step S126).

Figure 5:
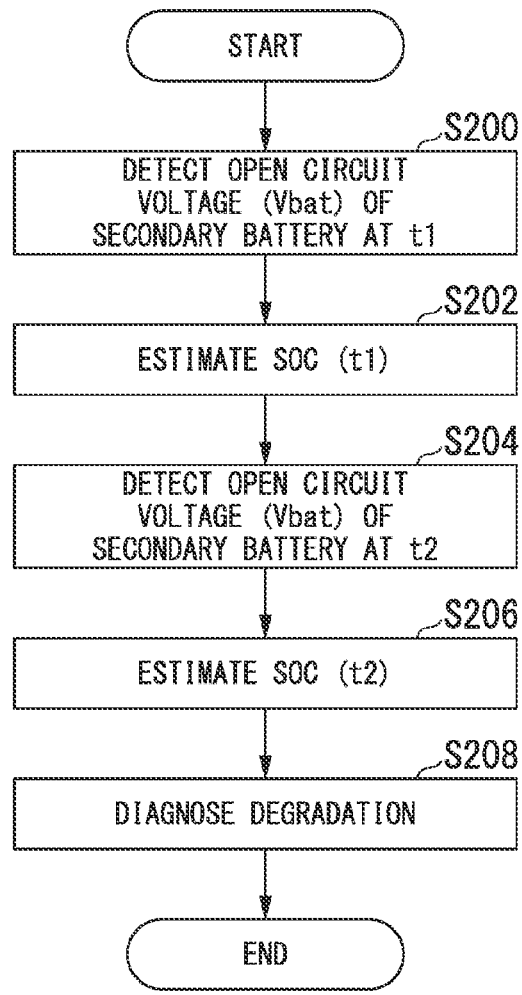
FIG. 5 is a flowchart showing an example of a procedure in which the degradation of a secondary battery is diagnosed on the basis of the SOC according to the embodiment.

FIG. 5 is a flowchart showing an example of a procedure in which the degradation of the secondary battery 122 is diagnosed on the basis of the SOC according to the embodiment. Although a process of diagnosing the degradation of the secondary battery 122 is described in the embodiment, the process of diagnosing the degradation of the secondary battery 122 is an example of a process of outputting the degradation of the secondary battery 122, and the process of outputting the degradation of the secondary battery 122 is not limited to diagnosing the degradation of the secondary battery 122.

The control part 140 detects the Vbat as a voltage that corresponds to an open circuit voltage of the secondary battery 122 at a first timing t1 (Step S200). The first timing t1 is, for example, a timing at which the vehicle V stops, the cable 400 is connected to the vehicle V, and control such that the charging electric power and the discharging electric power of the secondary battery 122 are zero or control such that the stored electric power of the secondary battery 122 is constant is performed. The control part 140 estimates a SOC (t1) on the basis of the voltage Vbat that is detected at the time t1 (Step S202).

The control part 140 detects the Vbat as a voltage that corresponds to an open circuit voltage of the secondary battery 122 at a second timing t2 (Step S204). The second timing t2 is, for example, a timing at which the vehicle V travels after the first timing t1, the vehicle V stops again, the cable 400 is connected to the vehicle V, and control such that the charging electric power and the discharging electric power of the secondary battery 122 are zero or control such that the stored electric power of the secondary battery 122 is constant is performed. The control part 140 estimates a SOC (t2) on the basis of the voltage Vbat that is detected at the second timing t2 (Step S206).

The control part 140 diagnoses the degradation of the secondary battery 122 on the basis of a ΔSOC which is a difference between the SOC (t1) and the SOC (t2) (Step S208). The control part 140 diagnoses the degradation of the secondary battery 122, for example, on the basis of the ΔSOC and a travel distance from the first timing t1 to the second timing t2.

As described above, according to the on-vehicle system 100 of the embodiment, it is possible to output the charge rate of the secondary battery 122 on the basis of the signal indicating the voltage of the secondary battery 122 which is acquired by the voltage sensor 126 in a state where the electric power supply part 110 is controlled such that the stored electric power of the secondary battery 122 is constant. As a result, according to the on-vehicle system 100 of the embodiment, it is possible to acquire the SOC of the secondary battery 122 with high accuracy. Further, according to the on-vehicle system 100 of the embodiment, it is possible to enhance the output accuracy of the degradation of the secondary battery 122 using the SOC.

According to the on-vehicle system 100 of the embodiment, in a case where the vehicle V stops and the SOC of the secondary battery 122 is output, since the output electric power of the electric power supply part 110 is controlled such that the stored electric power of the secondary battery 122 is constant, it is possible to detect the voltage that corresponds to the open circuit voltage of the secondary battery 122 and output the SOC, and it is possible to enhance the accuracy of the SOC.

According to the on-vehicle system 100 of the embodiment, since the SOC estimated by causing the stored electric power of the secondary battery 122 to be constant is used, it is possible to enhance the output accuracy of the degradation of the secondary battery 122.

Although an embodiment of the present invention has been described, the present invention is not limited to such an embodiment, and various modifications and substitutions can be made without departing from the scope of the present invention. In the above embodiment, the V2G system 1 is described; however, the embodiment is not limited thereto. The present invention is also applicable to a V1G system in which electric power is supplied in a single direction from the external electric power supply device 200 to the on-vehicle system 100. Further, the V2G system 1 of the embodiment described above includes a diagnosis part that diagnoses the degradation of the secondary battery 122 in the vehicle V; however, the embodiment is not limited thereto. The V2G system 1 may not include the diagnosis part in the vehicle V and may include a cloud server device that diagnoses the degradation of the secondary battery 122 on the basis of the SOC acquired via a communication network from the vehicle V.

What is claimed is:

1. An on-vehicle system, comprising:
an acquisition part that acquires a signal indicating a voltage of a secondary battery which is mounted on a vehicle;
an electric power supply part that uses electric power which is supplied from an external electric power supply device and that supplies the electric power to the secondary battery or an auxiliary machine mounted on the vehicle; and
an output part that outputs a charge rate of the secondary battery based on the signal indicating the voltage of the secondary battery which is acquired by the acquisition part,
wherein the electric power supply part controls output electric power such that stored electric power of the secondary battery is constant in a case where the vehicle stops and the charge rate of the secondary battery is output, and
the electric power supply part uses the electric power which is supplied from the external electric power supply device and outputs electric power that corresponds to a consumed electric power of the auxiliary machine in a case where the vehicle stops and the charge rate of the secondary battery is output.

2. The on-vehicle system according to claim 1, wherein the signal indicating the voltage of the secondary battery is a signal indicating a voltage that corresponds to an open circuit voltage of the secondary battery.

3. A secondary battery management system, comprising:
the on-vehicle system according to claim 1; and
a degradation output part that outputs a degradation of the secondary battery based on a change between a first charge rate which is output based on information indicating the voltage of the secondary battery acquired by the acquisition part at a first timing at which the vehicle stops and the electric power supply part is controlled such that the stored electric power of the secondary battery is constant, and a second charge rate which is output based on information indicating the voltage of the secondary battery acquired by the acquisition part at a second timing at which the vehicle stops and the electric power supply part is controlled such that the stored electric power of the secondary battery is constant.

4. A charge rate output method, including:

acquiring a signal indicating a voltage of a secondary battery which is mounted on a vehicle;

using electric power which is supplied from an external electric power supply device and supplying the electric power to the secondary battery or an auxiliary machine mounted on the vehicle; and outputting a charge rate of the secondary battery based on the signal indicating the voltage of the secondary battery, wherein output electric power is controlled such that stored electric power of the secondary battery is constant in a case where the vehicle stops and the charge rate of the secondary battery is output, and electric power that corresponds to a consumed electric power of the auxiliary machine is output using the electric power which is supplied from the external electric power supply device in a case where the vehicle stops and the charge rate of the secondary battery is output.

5. A computer-readable non-transitory recording medium that includes a program causing a computer of an on-vehicle system to execute:

acquiring a signal indicating a voltage of a secondary battery which is mounted on a vehicle;

using electric power which is supplied from an external electric power supply device and supplying the electric power to the secondary battery or an auxiliary machine mounted on the vehicle; and outputting a charge rate of the secondary battery based on the signal indicating the voltage of the secondary battery, to control output electric power such that stored electric power of the secondary battery is constant in a case where the vehicle stops and the charge rate of the secondary battery is output, and to use the electric power which is supplied from the external electric power supply device and output electric power that corresponds to a consumed electric power of the auxiliary machine in a case where the vehicle stops and the charge rate of the secondary battery is output.

* * * * *